United States Patent [19]

Kohashi et al.

[11] Patent Number: 4,575,742
[45] Date of Patent: Mar. 11, 1986

[54] EPITAXIAL WAFER FOR USE IN THE PRODUCTION OF AN INFRARED LED

[75] Inventors: Yasuji Kohashi, Tsuchiura; Yoshinobu Tsujikawa, Kyoto, both of Japan

[73] Assignee: Mitsubishi Monsanto Chemical Co., Ltd., Tokyo, Japan

[21] Appl. No.: 565,623

[22] Filed: Dec. 27, 1983

[30] Foreign Application Priority Data

Dec. 27, 1982 [JP] Japan .............................. 57-232210
Mar. 17, 1983 [JP] Japan .............................. 58-45094

[51] Int. Cl.⁴ ...................... H01L 33/00; H01S 3/19
[52] U.S. Cl. ........................................ 357/17; 357/16; 357/61; 357/63; 372/45
[58] Field of Search ................. 357/17, 16, 61, 63; 372/45

[56] References Cited

U.S. PATENT DOCUMENTS 4,008,485  2/1977  Miyoshi et al. ........................ 357/17
4,477,824 10/1984  Dutt ...................................... 357/17

FOREIGN PATENT DOCUMENTS 2408691  9/1974  Fed. Rep. of Germany ........ 357/17
0150094 11/1979  Japan .................................... 357/17
0036078 11/1979  Japan .................................... 372/45

OTHER PUBLICATIONS

Heinen, J. et al., *Proton Bombarded GaAlAs:GaAs Light Emitting Diodes*, IEEE Transactions on Electron Devices, Oct. 1976, p. 1186.
Tsarenkov et al., *Red Light Emitting Diodes Based on Variable-Gap Ga₁₋ₓAlₓAs:Si p-n Structures*, Soviet Physics–Semiconductors, vol. 6, No. 5, (Nov. 1972).
Sato, T. et al., *Si Doped Infrared Light Emitting Diodes*, National Technical Report, vol. 18 No. 3, Jun. 1972, Matsushita.
Kressel et al., *Close Confinement Gallium Aresinide PN Junction Lasers With Rduced Optical Loss at Room Temperature*, RCA Review, Mar. 1969, pp. 106–113.
Panish, M., *Heterostructure Injection Lasers*, Bell Laboratories Record, Nov. 1971, pp. 298–304.

*Primary Examiner*—James W. Davie
*Assistant Examiner*—Vangelis Economou
*Attorney, Agent, or Firm*—Burgess, Ryan & Wayne

[57] ABSTRACT

The present invention relates to a wafer for use in the production of an infrared LED. Conventionally, infrared LEDs are produced by using an epitaxial wafer comprising P- and N-type GaAs epitaxial layers. The wafer according to the present invention is characterized by having a P-type $Ga_{1-x}Al_xAs$ epitaxial layer and improves the output power of infrared LEDs. The epitaxial layers according to the present invention are (1) a 20–100 μm thick N-type GaAs epitaxial layer consisting of N-type GaAs doped with Si and having a carrier concentration in the range of from $1.0 \times 10^{17}.cm^{-3}$ to $2.0 \times 10^{18}.cm^{-3}$, (2) a 10–80 μm thick P-type GaAs epitaxial layer consisting of P-type GaAs doped with Si and having a carrier concentration in the range of from $1.0 \times 10^{17}.cm^{-3}$ to $5.0 \times 10^{18}.cm^{-3}$, and (3) a 5–90 μm thick mixed crystal layer consisting of P-type $Ga_{1-x}Al_xAs$ mixed crystal and having a carrier concentration of from $1.0 \times 10^{17}.cm^{-3}$ to $5.0 \times 10^{18}.cm^{-3}$, the mixed crystal ratio of $Ga_{1-x}Al_xAs$ being in the range of from 0.03 to 0.8 at least in a region of the mixed crystal layer, which is at least 2 μm thick when measured from the interface between the mixed crystal layer and the P-type GaAs epitaxial layer.

6 Claims, 2 Drawing Figures

EPITAXIAL WAFER FOR USE IN THE PRODUCTION OF AN INFRARED LED

FIELD OF THE INVENTION

The present invention relates to an epitaxial wafer which is suitable for use in the production of an infrared light-emitting diode, hereinafter referred to as an infrared LED. More particularly, the present invention relates to a multilayer epitaxial wafer comprising gallium arsenide, i.e., GaAs, and gallium aluminum arsenide, i.e., $Ga_{1-x}Al_xAs$.

Description of the Prior Art

Conventionally a GaAs epitaxial wafer consisting of GaAs doped with Si, which is an amphoteric impurity, is used for producing an infrared LED. This GaAs epitaxial wafer is produced by liquid-phase-epitaxy (LPE) method, in which GaAs doped with Si is epitaxially grown at high and low temperatures to form an N-type GaAs epitaxial layer and a P-type GaAs epitaxial layer, respectively, thereby creating a PN junction between the two epitaxial layers. The infrared LED which is produced by using the above-described GaAs epitaxial wafer exhibits a peak emission wavelength of from 900 nm to 980 nm. Since the external quantum efficiency of the infrared LED is higher than that of the visible light LED, the infrared LED can be applied in various ways.

Also, since the efficiency and output power of the conventional infrared LED is not sufficient to make it usable in the field of optical communication, an infrared LED having improved emission characteristics is desired.

SUMMARY OF THE INVENTION

It is an object of the present invention to provide an infrared LED which exhibits an efficiency and output power higher than those of the conventional infrared LED, which is made of a GaAs epitaxial wafer produced by the LPE of GaAs doped with Si.

In accordance with the objects of the present invention, there is provided an epitaxial wafer for use in the production of an infrared LED comprising:

a single crystalline semiconductor substrate consisting of N-type GaAs;

an N-type GaAs epitaxial layer consisting of N-type GaAs doped with Si, formed on the single crystalline semiconductor substrate, and having a thickness of from 20 μm to 100 μm and a carrier concentration in the range of from $1.0 \times 10^{17}.cm^{-3}$ to $2.0 \times 10^{18}.cm^{-3}$;

a P-type GaAs epitaxial layer consisting of P-type GaAs doped with Si, formed on the N-type GaAs epitaxial layer, and having a thickness of from 10 μm to 80 μm and a carrier concentration in the range of from $1.0 \times 10^{17}.cm^{-3}$ to $5.0 \times 10^{18}.cm^{-3}$; and a mixed crystal layer consisting of P-type $Ga_{1-x}Al_xAs$ mixed crystal, formed on the P-type GaAs epitaxial layer, and having a thickness of from 5 μm to 90 μm and a carrier concentration of from $1.0 \times 10^{17}.cm^{-3}$ to $5.0 \times 10^{18}.cm^{-3}$, the mixed crystal ratio of $Ga_{1-x}Al_xAs$ being in the range of from 0.03 to 0.8 at least in a region of the mixed crystal layer, which is at least 2 μm thick when measured from the interface between the mixed crystal layer and the P-type GaAs epitaxial layer.

DESCRIPTION OF THE PREFERRED EMBODIMENTS

Figure 1:
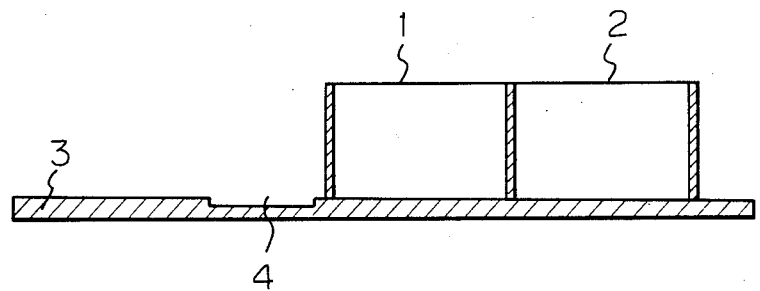
FIG. 1 is a longitudinal cross-sectional view of a sliding-type LPE apparatus having two containers.
Figure 2:
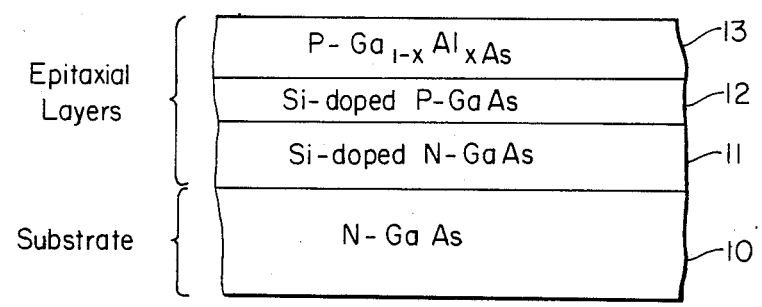
FIG. 2 is a cross-sectional view of a wafer according to the present invention.

The single crystalline semiconductor substrate 10 of the wafer according to the present invention may consist of N-type GaAs which has a carrier concentration preferably in the range of from $1.0 \times 10^{17}.cm^{-3}$ to $2.0 \times 10^{18}.cm^{-3}$. The dopant, which provides the GaAs with an N-type conductivity, is not limited but is preferably Si, Te, S, or Se, more preferably Si, which is the same dopant as that used in the epitaxial layers.

The single crystalline semiconductor substrate 10 of the wafer according to the present invention preferably has a {100} orientation, i.e., the wafer surface has a {100} orientation. A single crystalline semiconductor substrate having a {111} orientation or another orientation can also be used. By using a {100} wafer, it is possible to produce square or rectangular infrared LED chips since the {110} planes, i.e., the cleavage planes, of the wafer intersect perpendicular to each other on the wafer surface.

The epitaxial layers, i.e., the P- and N-type GaAs epitaxial layers, as well as the mixed crystal layer, are advantageously formed by the LPE method. The LPE apparatus is not specifically limited but is preferably a known one which comprises a slidable boat body and a plurality of melt containers, vessels, recesses, or the like which are formed in the slidable boat body. If two vessels are formed in the slidable boat body, a Ga solution containing GaAs is held in one vessel and a Ga solution containing $Ga_{1-x}Al_xAs$ is held in the other vessel. The Ga solution containing $Ga_{1-x}Al_xAs$ is usually prepared by dissolving into Ga a predetermined amount of GaAs and Al.

The first epitaxial layer 11, i.e., the N-type GaAs epitaxial layer, is formed by bringing the single crystalline semiconductor substrate into contact with a Ga solution, containing GaAs and Si as dopant, at a high temperature and cooling the Ga solution at a predetermined cooling rate. The initial contacting temperature of the single crystalline semiconductor substrate is higher than the inversion temperature at which the conductivity of GaAs doped with Si changes from an N-type to a P-type. The inversion temperature depends on the Si concentration of the Ga solution, mentioned above, but is usually in the range of from 840° C. to 900° C. The concentration of the GaAs which is dissolved in the Ga is preferably from 10% to 20% by weight, more preferably from 13% to 16% by weight.

The N-type GaAs epitaxial layer 11 has a carrier concentration in the range of from $1.0 \times 10^{17}.cm^{-3}$ to $2.0 \times 10^{18}.cm^{-3}$ since at a carrier concentration of less than $1.0 \times 10^{17}.cm^{-3}$ the threshold voltage ($V_f$) becomes very high and at a carrier concentration of more than $2.0 \times 10^{18}.cm^{-3}$ the crystal properties of the N-type GaAs epitaxial layer are deteriorated. The N-type GaAs epitaxial layer has a thickness in the range of from 20 μm to 100 μm since at a thickness of less than 20 μm its crystal properties are liable to deteriorate due to the influence of the single crystalline semiconductor substrate and since at a thickness of more than 100 μm the crystal properties of the N-type GaAs layer are not improved and the productivity is lessened.

The second epitaxial layer 12, i.e., the P-type GaAs epitaxial layer, is formed by cooling the Ga solution used for forming the N-type GaAs epitaxial layer to a temperature below the inversion temperature. The P-type carrier concentration of the P-type GaAs epitaxial layer is from $1.0 \times 10^{17}.cm^{-3}$ to $5 \times 10^{18}.cm^{-3}$ since at a carrier concentration of less than $1.0 \times 10^{17}.cm^{-3}$ the threshold voltage ($V_f$) becomes very high and at a carrier concentration of more than $5 \times 10^{18}.cm^{-3}$ the crystal properties of the P-type GaAs epitaxial layer are impaired and the absorption of light thereby is disadvantageously increased. The P-type GaAs epitaxial layer has a thickness in the range of from 10 μm to 80 μm, preferably in the range of from 20 μm to 50 μm. If the thickness is less than 10 μm, almost all of the carriers can be recombined in the mixed crystal layer to emit infrared light, with the result that the emission wavelength shifts to the shorter wavelength side. On the other hand, if the thickness is more than 80 μm, the absorption of light by the P-type GaAs epitaxial layer is disadvantageously increased. The above-mentioned preferable thickness, i.e., from 20 μm to 50 μm, of the P-type GaAs epitaxial layer is less than the diffusion length of the minority carriers, with the result that part of the carriers can be recombined in the mixed crystal layer to emit infrared light.

The third epitaxial layer 13, i.e., the mixed crystal layer, is formed, upon completion of the P-type GaAs epitaxial layer, by contacting the P-type GaAs epitaxial layer with a Ga solution containing $Ga_{1-x}Al_xAs$ and a P-type dopant, such as Zn, Cd, Si, or the like. The mixed crystal layer consists of $Ga_{1-x}Al_xAs$ mixed crystal with a P-type dopant.

The mixed crystal layer 13 has a thickness of from 5 μm to 90 μm since at a thickness of less than 5 μm the mixed crystal layer is not effective for enhancing the emission efficiency and since at a thickness of more than 90 μm the emission efficiency is not appreciably enhanced and the productivity of a wafer is disadvantageously lessened. If the wafer according to the present invention is used for the production of an infrared LED energized at a low current density, for example, from $0.4.A.cm^{-2}$ to $20.A.cm^{-2}$, the thickness of the mixed crystal layer is preferably from 5 μm to less than 20 μm.

The carrier concentration of the mixed crystal layer is from $1.0 \times 10^{17}.cm^{-3}$ to $5 \times 10^{18}.cm^{-3}$ since at a carrier concentration of less than $1.0 \times 10^{17}.cm^{-3}$ the threshold voltage ($V_f$) becomes very high and at a carrier concentration of more than $5 \times 10^{18}.cm^{-3}$ the crystal properties of the layer are impaired and the absorption of light by the layer is disadvantageously increased.

The mixed crystal ratio "x" of P-type $Ga_{1-x}Al_xAs$, i.e., the Al concentration, slightly decreases in the growth direction due to the Al segregation and is in the range of from 0.03 to 0.8 ($0.03 \leq x \leq 0.8$), preferably in the range of from 0.05 to 0.5 ($0.05 \leq x \leq 0.5$), at least in a portion of the mixed crystal layer including the P-P interface, i.e., the interface between the mixed crystal layer and the P-type GaAs epitaxial layer, and having a thickness of 2 μm. If the mixed crystal ratio "x" is less than 0.03, the mixed crystal layer is not effective for enhancing the emission efficiency. On the other hand, if the mixed crystal ratio "x" exceeds 0.8, the resistance between the mixed crystal layer and an electrode deposited on the layer to produce an infrared LED is disadvantageously high, and the resistance at the P-P interface is disadvantageously high.

The dopant of the mixed crystal layer is preferably Si because a wafer according to the present invention can be easily produced by a multilayer LPE method due to non-contamination of the LPE apparatus.

The infrared LED can be produced by subjecting a wafer according to the present invention to conventional steps, such as depositing electrodes on both surfaces of the wafer and cutting it into chips.

The infrared LED produced by using a wafer according to the present invention exhibits an emission output from 1.4 to 3 times as high as the conventional infrared LED, especially at a low current density of from $0.4 A.cm^{-2}$ to $20 A.cm^{-2}$. The infrared LED produced by using a wafer according to the present invention can be very valuably used in the field of optical communication and other opto-electronics fields.

The present invention is hereinafter described with reference to the examples and comparative examples.

The sliding-type LPE apparatus shown in FIG. 1 was used in the examples and comparative examples. Reference numerals 1 and 2 denote a container for holding a Ga solution containing GaAs and a container for holding a Ga solution containing $Ga_{1-x}Al_xAs$, respectively. The containers 1 and 2 are integrally slidably mounted on a base 3. Reference numeral 4 denotes the recess of the base 3 where a single crystalline semiconductor substrate (not shown) is located. The containers 1 and 2 are successively brought into contact with the single crystalline semiconductor substrate to form the epitaxial layers.

EXAMPLE 1

Into the container 1, 100 g of Ga, 15.9 g of GaAs, and 0.3 g of Si were loaded, and into the container 2, 100 g of Ga, 5.1 g of GaAs, 0.025 g of Al, and 0.3 g of Si were loaded. Into the recess 4, an N-type GaAs substrate having a (100) orientation, doped with Si, and having a carrier concentration of $7 \times 10^{17}.cm^{-3}$ was placed. Before the N-type GaAs substrate was brought into contact with the Ga solutions, the sliding-type LPE apparatus was installed in a furnace, and the atmosphere within the furnace was replaced with nitrogen and then with hydrogen. After replacement of the furnace atmosphere, the temperature of the furnace was elevated to 910° C. and maintained at 910° C. for 120 minutes. During temperature elevation and maintenance, a hydrogen stream was introduced to flow through the furnace. Then the containers 1 and 2 were slid in the direction of the N-type GaAs substrate to bring the Ga solution in the container 1 into contact with the N-type GaAs substrate, and the temperature of the furnace was lowered, at a rate of 1.0° C./min., to 850° C. Then the cooling rate was changed to 0.5° C./min. and cooling from 850° C. to 840° C. was carried out. Next, the containers 1 and 2 were further slid in the direction of the N-type GaAs substrate to bring the Ga solution in the container 2 into contact with the N-type GaAs substrate and thus to carry out epitaxial growth of P-type $Ga_{1-x}Al_xAs$. The temperature of the furnace was lowered from 840° C. to 820° C. at a rate of 1° C./min. while maintaining the contact between the Ga solution in the container 2 and the N-type GaAs substrate. Then the containers 1 and 2 were slid away from the N-type GaAs substrate to break the above-mentioned contact, and the temperature of the furnace was cooled to room temperature.

EXAMPLE 2

The procedure of Example 1 was repeated except that: the materials loaded in the container 2 were 100 g of Ga, 6.4 g of GaAs, and 0.025 g of Al; the temperature at which the cooling rate was changed from 1.0° C./min. to 0.5° C./min. was 840° C.; the temperature at which the container 1 was replaced with the container 2 was 820° C.; and the temperature at which the contact between the substrate and the Ga solution was broken was 800° C.

COMPARATIVE EXAMPLE 1

Into the container 1, 100 g of Ga, 15.9 g of GaAs, and 0.3 g of Si were loaded, and into the container 2, no materials were loaded. Into the recess 4, an N-type GaAs substrate having a (100) orientation, doped with Si, and having a carrier concentration of $7 \times 10^{17}.cm^{-3}$ was placed. Before the N-type GaAs substrate was brought into contact with the Ga solutions, the sliding-type LPE apparatus was installed in a furnace, and the atmosphere within the furnace was replaced with nitrogen and then with hydrogen. After replacement of the furnace atmosphere, the temperature of the furnace was elevated to 910° C. and maintained at 910° C. for 120 minutes. During temperature elevation and maintenance, a hydrogen stream was introduced to flow through the furnace. Then the containers 1 and 2 were slid in the direction of the N-type GaAs substrate to bring the Ga solution in the container 1 into contact with the N-type GaAs substrate, and the temperature of the furnace was lowered, at a rate of 1.0° C./min., to 800° C. Then the cooling rate was changed to 0.5° C./min. and cooling from 800° C. to 760° C. was carried out. Next, the containers 1 and 2 were slid away from the N-type GaAs substrate to break the above-mentioned contact, and the temperature of the furnace was cooled to room temperature.

The following table shows the physical properties of the wafers produced in this Comparative Example and in Examples 1 and 2.

TABLE 1

|  |  | Example 1 | Example 2 | Comparative Example |
| --- | --- | --- | --- | --- |
| N-Type GaAs Epitaxial Layer | d c.c. | 63 $3.0 \times 10^{17}$ | 65 $2.5 \times 10^{17}$ | 64 $3.0 \times 10^{17}$ |
| P-Ttype GaAs Epitaxial Layer | d c.c. | 15 $8.0 \times 10^{17}$ | 25 $8.5 \times 10^{17}$ | 80 $9.0 \times 10^{17}$ |
| P-Type $Ga_{1-x}Al_xAs$ Epitaxial Layer | d c.c | 15 $1.0 \times 10^{18}$ | 15 $9.5 \times 10^{17}$ | — |
| Mixed Crystal Ratio "x" |  | 0.15 | 0.15 | — |

In Tables 1 and 3, "d" indicates the thickness in micrometers, "c.c" indicates the carrier concentration in $cm^{-3}$, and the mixed crystal ratio "x" is the value at 2 μm from the p—p interface.

EXAMPLE 4 (APPLICATION EXAMPLE)

Twenty infrared LEDs were produced from the wafer of Example 1, 20 from the wafer of Example 2, and 20 from the wafer of Comparative Example 1. The infrared LEDs were in the form of square chips 0.5 mm×0.5 mm in size. The output power was measured at a current density of 4.5 A.cm$^{-2}$. The following table shows the output power of the infrared LEDs produced from the wafers of Examples 1 and 2. The values in the table are relative average values with the proviso that the output power is "1" in Comparative Example 1.

TABLE 2

| Example | 1 | 2 |
| --- | --- | --- |
| Output Power Output (Relative Value) | 1.4 | 1.5 |

The peak wavelength of all of the infrared LEDs was in the range of from 940 nm to 945 nm.

EXAMPLE 5

Into the container 1, 100 g of Ga, 15.9 g of GaAs, and 0.3 g of Si were loaded, and into the container 2, 100 g of Ga, 5.1 g of GaAs, 0.025 g of Al, and 0.2 g of Si were loaded. Into the recess 4, an N-type GaAs substrate having a (100) orientation, doped with Si, and having a carrier concentration of $7 \times 10^{17}.cm^{-3}$ was placed. Before the N-type GaAs substrate was brought into contact with the Ga solutions, the sliding-type LPE apparatus was installed in a furnace, and the atmosphere within the furnace was replaced with nitrogen and then with hydrogen. After replacement of the furnace atmosphere, the temperature of the furnace was elevated to 910° C. and maintained at 910° C. for 120 minutes. During temperature elevation and maintenance, a hydrogen stream was introduced to flow through the furnace. Then the containers 1 and 2 were slid in the direction of the N-type GaAs substrate to bring the Ga solution in the container 1 into contact with the N-type GaAs substrate, and the temperature of the furnace was lowered, at a rate of 0.8° C./min., to 840° C. Next, the containers 1 and 2 were further slid in the direction of the N-type GaAs substrate to bring the Ga solution in the container 2 into contact with the N-type GaAs substrate and thus to carry out epitaxial growth of P-type $Ga_{1-x}Al_xAs$. The temperature of the furnace was lowered from 840° C. to 700° C. at a rate of 1° C./min. while maintaining the contact between the Ga solution in the container 2 and the N-type GaAs substrate. Then the containers 1 and 2 were slid away from the N-type GaAs substrate to break the above-mentioned contact and the temperature of the furnace was cooled to room temperature.

EXAMPLE 6

The procedure of Example 5 was repeated except that the materials loaded in the container 2 were 100 g of Ga, 6.4 g of GaAs, and 0.025 g of Al and the temperature at which the container 1 was replaced with the container 2 was 820° C.

EXAMPLE 7

The procedure of Example 5 was repeated except that the materials loaded in the container 2 were 100 g of Ga, 4.2 g of GaAs, and 0.022 g of Al and the temperature at which the container 1 was replaced with the container 2 was 800° C.

EXAMPLE 8

The procedure of Example 5 was repeated except that the materials loaded in the container 2 were 100 g of Ga, 3.54 g of GaAs, and 0.018 g of Al and the temperature at which the container 1 was replaced with the container 2 was 780° C.

EXAMPLE 9

The procedure of Example 5 was repeated except that the materials loaded in the container 2 were 100 g of Ga, 3.7 g of GaAs, and 0.052 g of Al and the temperature at which the container 1 was replaced with the container 2 was 800° C.

COMPARATIVE EXAMPLE 2

Into the container 1, 100 g of Ga, 15.9 g of GaAs, and 0.3 g of Si were loaded, and into the container 2, no materials were loaded. Into the recess 4, an N-type GaAs substrate having a (100) orientation, doped with Si, and having a carrier concentration of $7 \times 10^{17}.cm^{-3}$ was placed. Before the N-type GaAs substrate was brought into contact with the Ga solutions, the sliding-type LPE device was installed in a furnace, and the atmosphere within the furnace was replaced with nitrogen and then with hydrogen. After replacement of the furnace atmosphere, the temperature of the furnace was elevated to 910° C. and maintained at 910° C. for 120 minutes. During temperature elevation and maintenance, a hydrogen stream was introduced to flow through the furnace. Then the containers 1 and 2 were slid in the direction of the N-type GaAs substrate to bring the Ga solution in the container 1 into contact with the N-type GaAs substrate, and the temperature of the furnace was lowered, at a rate of 0.8° C./min., to 700° C. Next, the containers 1 and 2 were slid away from the N-type GaAs substrate to break the above-mentioned contact, and the temperature of the furnace was cooled to room temperature.

TABLE 3

|  |  | Example 5 | Example 6 | Example 7 | Example 8 | Example 9 | Comparative Example |
|---|---|---|---|---|---|---|---|
| N-Type GaAs Epitaxial Layer | d. | 63 | 65 | 64 | 60 | 62 | 64 |
|  | c.c. | $3.0 \times 10^{17}$ | $2.5 \times 10^{17}$ | $3.5 \times 10^{17}$ | $3.0 \times 10^{17}$ | $3.0 \times 10^{17}$ | $3.0 \times 10^{17}$ |
| P-Type GaAs Epitaxial Layer | d. | 15 | 25 | 45 | 60 | 40 | 93 |
|  | c.c. | $8.0 \times 10^{17}$ | $8.5 \times 10^{17}$ | $9.0 \times 10^{17}$ | $9.5 \times 10^{17}$ | $8.5 \times 10^{17}$ | $9.0 \times 10^{17}$ |
| P-Type $Ga_{1-x}Al_xAs$ Epitaxial Layer | d. | 75 | 65 | 50 | 30 | 63 | — |
|  | c.c. | $1.0 \times 10^{18}$ | $9.5 \times 10^{17}$ | $9.0 \times 10^{17}$ | $8.5 \times 10^{17}$ | $9.5 \times 10^{17}$ |  |
| Mixed Crystal Ratio "x" |  | 0.15 | 0.15 | 0.15 | 0.15 | 0.25 | — |

EXAMPLE 10 (APPLICATION EXAMPLE)

The procedure of Example 4 was repeated except that the current density was 4 A.cm$^{-2}$, corresponding to 10 mA of the current. The output power is shown in Table 4.

TABLE 4

| Example | 5 | 6 | 7 | 8 | 9 |
|---|---|---|---|---|---|
| Output Power | 1.2 | 1.9 | 1.7 | 1.2 | 1.6 |

TABLE 4-continued

| Example | 5 | 6 | 7 | 8 | 9 |
|---|---|---|---|---|---|
| (Relative Value) |  |  |  |  |  |

The peak wavelength of all of the infrared LEDs was in the range of from 940 nm to 945 nm.

We claim:

1. In an infrared light-emitting diode, an epitaxial wafer comprising:
a single crystalline semiconductor substrate consisting of N-type GaAs;
an N-type GaAs epitaxial layer consisting of N-type GaAs doped with Si, formed on said single crystalline semiconductor substrate, and having a thickness of from 20 μm to 100 μm and a carrier concentration in the range of from $1.0 \times 10^{17}.cm^{-3}$ to $2.0 \times 10^{18}.cm^{-3}$;
a P-type GaAs epitaxial layer consisting of P-type GaAs doped with Si, formed on said N-type GaAs epitaxial layer, and having a thickness of from 10 μm to 80 μm and a carrier concentration in the range of from $1.0 \times 10^{17}.cm^{-3}$ to $5.0 \times 10^{18}.cm^{-3}$; and
a mixed crystal layer consisting of P-type $Ga_{1-x}Al_xAs$ with a mixed crystal ratio "x", formed on said P-type GaAs epitaxial layer, and having a thickness of from 5 μm to 90 μm and a carrier concentration of from $1.0 \times 10^{17}.cm^{-3}$ to $5.0 \times 10^{18}.cm^{-3}$, the mixed crystal ratio of $Ga_{1-x}Al_xAs$ being in the range of from 0.03 to 0.8 at least in a region of the mixed crystal layer, which is at least 2 μm thick when measured from the interface between said mixed crystal layer and said P-type GaAs epitaxial layer.

2. An epitaxial wafer according to claim 1, wherein the thickness of said mixed crystal layer is from 5 μm to less than 20 μm.

3. An epitaxial wafer according to claim 1, wherein the thickness of said mixed crystal layer is from 20 μm to 90 μm.

4. An epitaxial wafer according to claim 1, wherein the mixed crystal ratio of said mixed crystal layer is from 0.05 to 0.5.

5. An epitaxial wafer according to claim 1, wherein the thickness of said P-type GaAs epitaxial layer is from 20 μm to 50 μm.

6. An epitaxial wafer according to claim 1, wherein the dopant of said mixed crystal layer is Si.

* * * * *

REEXAMINATION CERTIFICATE (2114th)
United States Patent
Kohashi et al.

[11] B1 4,575,742
[45] Certificate Issued  Oct. 26, 1993

[54] EPITAXIAL WAFER FOR USE IN THE PRODUCTION OF AN INFRARED LED

[75] Inventors: Yasuji Kohashi, Tsuchiura; Yoshinobu Tsujikawa, Kyoto, both of Japan

[73] Assignee: Mitsubishi Kasei Polytec Company, Japan

Reexamination Request:
No. 90/002,918, Dec. 17, 1992

Reexamination Certificate for:
Patent No.: 4,575,742
Issued: Mar. 11, 1986
Appl. No.: 565,623
Filed: Dec. 27, 1983

[30] Foreign Application Priority Data

Dec. 27, 1982 [JP] Japan ................. 57-232210
Mar. 17, 1983 [JP] Japan ................. 58-45094

[51] Int. Cl.$^5$ ........................... H01L 33/00; H01S 3/19
[52] U.S. Cl. .......................... 148/33.4; 257/94; 372/45; 437/119; 437/127; 437/130; 437/133
[58] Field of Search ........................ 257/94, 101, 102

[56] References Cited

U.S. PATENT DOCUMENTS

| | | | |
|---|---|---|---|
| 3,560,275 | 2/1971 | Kressel et al. | 257/102 |
| 3,600,240 | 8/1971 | Ruprecht et al. | 257/102 |
| 3,676,228 | 7/1972 | Sakurai et al. | 257/102 |
| 3,758,875 | 9/1973 | Hayashi | 257/95 |
| 4,008,485 | 2/1977 | Miyoshi et al. | 257/102 |
| 4,035,205 | 7/1977 | Lebailly et al. | 257/102 |
| 4,507,157 | 3/1985 | Oliver, Jr. | 257/101 |

FOREIGN PATENT DOCUMENTS 56-24987 3/1981 Japan .

*Primary Examiner*—William D. Larkins

[57] ABSTRACT

The present invention relates to a wafer for use in the production of an infrared LED. Conventionally, infrared LEDs are produced by using an epitaxial wafer comprising P- and N-type GaAs epitaxial layers. The wafer according to the present invention is characterized by having a P-type $Ga_{1-x}Al_xAs$ epitaxial layer and improves the output power of infrared LEDs. The epitaxial layers according to the present invention are (1) a 20–100 μm N-type GaAs epitaxial layer consisting of N-type GaAs doped with Si and having a carrier concentration in the range of from $1.0 \times 10^{17}.cm^{-3}$ to $2.0 \times 10^{18}.cm^{-3}$, (2) a 10–80 μm thick P-type GaAs epitaxial layer consisting of P-type GaAs doped with Si and having a carrier concentration in the range of from $1.0 \times 10^{17}.cm^{-3}$ to $5.0 \times 10^{18}.cm^{-3}$, and (3) a 5–90 μm thick mixed crystal layer consisting of P-type $Ga_{1-x}Al_xAs$ mixed crystal and having a carrier concentration of from $1.0 \times 10^{17}.cm^{-3}$ to $5.0 \times 10^{18}.cm^{-3}$, the mixed crystal ratio of $Ga_{1-x}Al_xAs$ being in the range of from 0.03 to 0.8 at least in a region of the mixed crystal layer, which is at least 2 μm thick when measured from the interface between the mixed crystal layer and the P-type GaAs epitaxial layer.

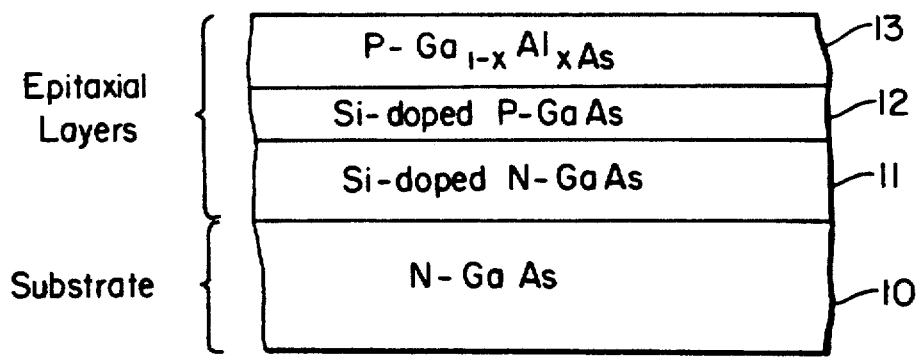

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-6 is confirmed.

* * * * *